(12) United States Patent
Sudo et al.

(10) Patent No.: US 9,932,692 B2
(45) Date of Patent: Apr. 3, 2018

(54) VITREOUS SILICA CRUCIBLE

(71) Applicant: SUMCO CORPORATION, Minato-ku, Tokyo (JP)

(72) Inventors: Toshiaki Sudo, Akita (JP); Tadahiro Sato, Akita (JP); Ken Kitahara, Akita (JP); Eriko Kitahara, Akita (JP)

(73) Assignee: SUMCO CORPORATION, Tokyo (JP)

( * ) Notice: Subject to any disclaimer, the term of this patent is extended or adjusted under 35 U.S.C. 154(b) by 87 days.

(21) Appl. No.: 14/901,036

(22) PCT Filed: Jun. 30, 2013

(86) PCT No.: PCT/JP2013/067948
§ 371 (c)(1),
(2) Date: Dec. 27, 2015

(87) PCT Pub. No.: WO2015/001593
PCT Pub. Date: Jan. 8, 2015

(65) Prior Publication Data
US 2016/0201216 A1    Jul. 14, 2016

(51) Int. Cl.
*C30B 15/10* (2006.01)
*C30B 29/06* (2006.01)
*C03B 19/09* (2006.01)

(52) U.S. Cl.
CPC .......... *C30B 29/06* (2013.01); *C03B 19/095* (2013.01); *C30B 15/10* (2013.01); *Y02P 40/57* (2015.11)

(58) Field of Classification Search
CPC .............................. C30B 15/00; C30B 15/10
See application file for complete search history.

(56) References Cited

U.S. PATENT DOCUMENTS

| 6,548,131 B1* | 4/2003 | Fabian | C03B 19/095 |
| | | | 118/726 |
| 2009/0151624 A1* | 6/2009 | Shimazu | C30B 15/10 |
| | | | 117/208 |
| 2011/0011228 A1* | 1/2011 | Sato | B28D 1/24 |
| | | | 83/54 |

(Continued)

FOREIGN PATENT DOCUMENTS

| JP | 5024969 A | 2/1993 |
| JP | 2004250304 A | 9/2004 |
| JP | 2006169084 A | 6/2006 |

(Continued)

OTHER PUBLICATIONS

International Search Report (ISR) dated Aug. 6, 2013, issued for International application No. PCT/JP2013/067948.

*Primary Examiner* — Robert M Kunemund
(74) *Attorney, Agent, or Firm* — Law Office of Katsuhiro Arai

(57) ABSTRACT

A vitreous silica crucible includes: a substantially cylindrical straight body portion having an opening on a top end and extending in a vertical direction; a curved bottom portion; and a corner portion connecting the straight body portion with the bottom portion and a curvature of which is greater than that of the bottom portion, wherein an inner surface of the crucible has a concavo-convex structure in which groove-shaped valleys are interposed between ridges, and an average interval of the ridges is 5-100 μm.

3 Claims, 3 Drawing Sheets

(56) References Cited

U.S. PATENT DOCUMENTS

2012/0167821 A1* 7/2012 Sudo ................... C30B 35/002
                                                                        117/200
2012/0255487 A1   10/2012  Sudo et al.

FOREIGN PATENT DOCUMENTS

| JP | 2009143769 A | 7/2009 |
|---|---|---|
| WO | 2011074568 A1 | 6/2011 |

* cited by examiner

[Fig.1]
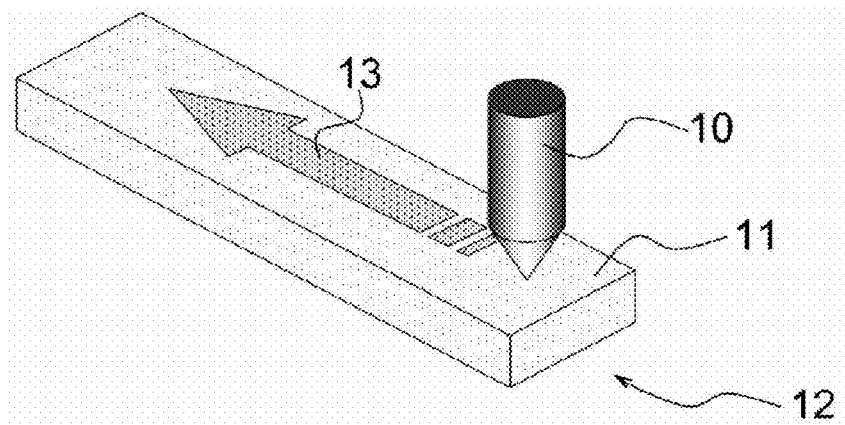
[Fig.2]
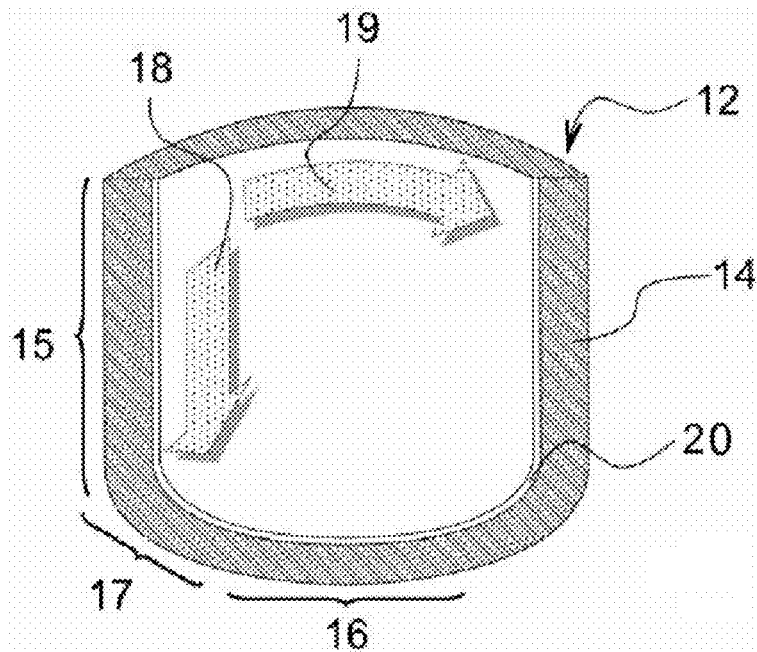

[Fig.3]
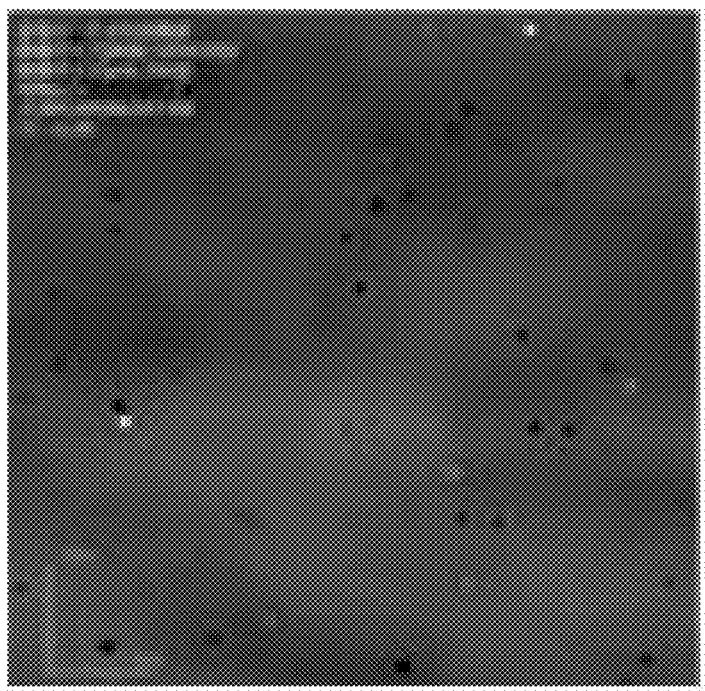
[Fig.4]
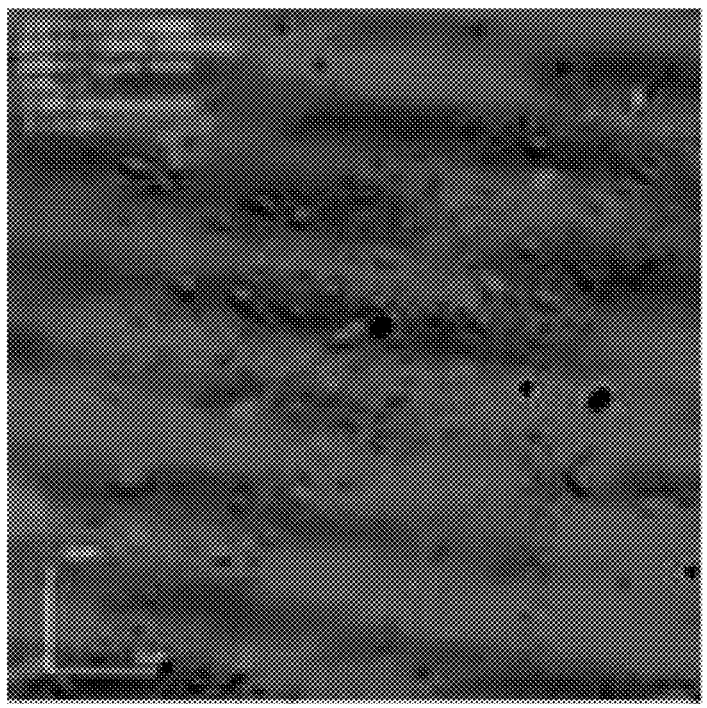

[Fig.5]
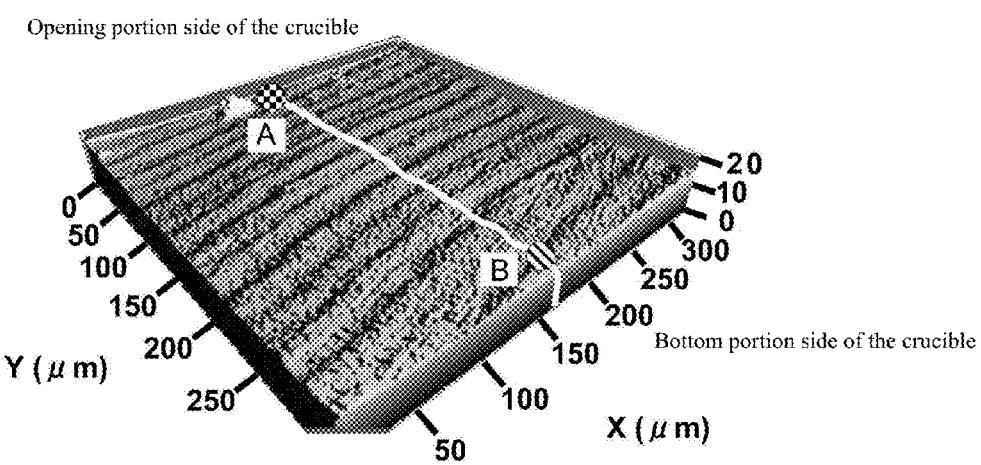
[Fig.6]
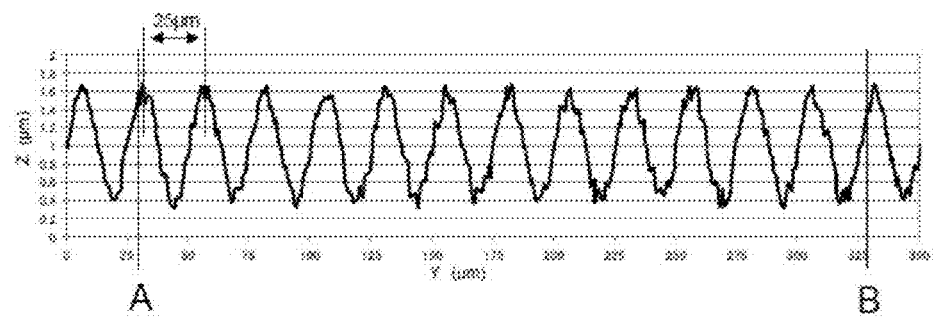

VITREOUS SILICA CRUCIBLE

This application is the U.S. National Phase under 35 U.S.C. § 371 of International Application PCT/JP2013/067948, filed Jun. 30, 2013. The International Application was published under PCT Article 21(2) in a language other than English.

TECHNICAL FIELD

The present invention relates to a vitreous silica crucible which has a concavo-convex structure in the inner surface of the crucible.

BACKGROUND ART

In pulling of silicon single crystal by Czochralski method (the CZ method), a single crystal can be pulled up by pulling a seed crystal immersed in silicon melt. In particular, an external carbon heater is heated to a temperature of about 1450-1600 deg. C., silicon melt obtained by melting polycrystalline silicon raw material is held in a vitreous silica crucible, a seed crystal of a silicon single crystal is contacted with the surface of the silicon melt having a melting point temperature of about 1420 deg. C. and gradually pulled while being rotated, the seed crystal of silicon single crystal is grown as a core, and thus a silicon single crystal is manufactured gradually while controlling the pulling rate and the melt temperature. In order to maintain the solid-liquid interface of the silicon melt central part which is contacted with the single crystal close to the silicon melting point of 1420 deg. C., the temperature of the vitreous silica crucible is as high as 1450-1600 deg. C. In pulling of silicon single crystal which can last 2 weeks or more, the extent of deformation of a sidewall sagging of a rim portion of the vitreous silica crucible may be 5 cm or more.

In the pulling of silicon single crystal, firstly, the crystal in the center of this seed crystal is widened (shoulder formation) until the desired diameter is obtained. Next, a single crystal shaped as cylindrical ingot is pulled up by performing body pulling. Finally, a single crystal is pulled up by narrowing the bottom portion. In the vitreous silica crucible having a diameter of 610-1015 mm (silicon ingot diameter: 200 mm, 300 mm, 450 mm), a large size single crystal silicon ingot such as those having a length of 2 m or more is manufactured. The single-crystal wafer manufactured from such a large size ingot is suitable for manufacturing flash memory or DRAM.

Since price reduction and high performance of flash memory or DRAM are progressing rapidly, to respond to the demand, a large size single crystal silicon ingot is required to be manufactured with high quality and at low cost. Therefore, a large size crucible is required to be manufactured with high quality and at low cost.

Moreover, although the present process using a wafer having a diameter of 300 mm is mainstream, a process using a large diameter wafer having a diameter of 450 mm is in development. For this reason, in order to manufacture a large diameter wafer having a diameter of 450 mm stably, a large size crucible with high quality has been on demand increasingly. However, in the manufacture of a large size vitreous silica crucible, problems exist as follows.

A phenomenon that the surface of the silicon melt vibrates periodically can be seen during pulling of the silicon single crystal. This is called a melt surface vibration. When the melt surface vibration occurs, the seed crystal is difficult to be contacted with a flat silicon melt surface, and a silicon single crystal cannot be pulled up. In addition, when the melt surface vibration occurs during pulling, a dislocation occurs, and the silicon is polycrystallized, and therefore, it becomes a problem that it is unable to be all used as a product. In particular, in the processes of dipping of the seed crystal and the shoulder formation, which are initial processes in pulling of silicon single crystal, are likely to be affected adversely by melt surface vibration. The influence largely determines the quality of the pulled silicon single crystal ingot.

The cause of melt surface vibration is considered as follows. In general, the reaction of $SiO_2$ (solid)→Si (liquid)+2O occurs on the interface between the silicon melt and the vitreous silica to dissolve the vitreous silica. It is considered that, due to, for example, an increase in the pulling temperature and decrease in the ambient pressure, a reaction of Si (liquid)+O→SiO (gas) occurs, and the melt surface vibrates as the SiO gas rises from inside of the melt. For a large size vitreous silica crucible, the distance from the outside carbon heater to the central part of the silicon melt is greater than the conventional ones (more than 500 mm, and conventionally it was about 300 mm), thus an increasing temperature of the carbon heater during pulling cannot be avoided. That is, with an increase in the diameter of the silicon ingot, the melt surface vibration problem increases when the carbon heater temperature during pulling is increased. For this reason, the silicon melt surface vibration associated with the temperature increase during pulling is intensified, which needs to be suppressed. Therefore, for the purpose of improving the single-crystal yield of the silicon single crystal, it is necessary to suppress melt surface vibration occurring in the silicon melt.

In order to solve the problem of melt surface vibration, for example, Patent Literature 1 discloses a crucible as follows: A vitreous silica surface made of a first component of silica sand is formed on the inner surface of a silica crucible having an opaque layer and a transparent layer, thereafter, a vitreous silica made of a second component of silica sand is scattered and melted, and a vitreous silica made of synthetic silica sand is formed on the inner surface of a corner portion as well as a bottom portion. A technique of adjusting the bubble content of the inner surface layer of the crucible in a region near the melt surface at the beginning of pulling to a certain range is disclosed. This is due to the fact that it has been found based on the same principle as that of boiling stone which suppresses explosive boiling, micro concaves and convexes suppress melt surface vibration of silicon melt.

Patent Literature 2 discloses a technique to suppress melt surface vibration of silicon melt filled in a vitreous silica crucible by providing micro concaves in the crucible inner face layer. This is due to the fact that it has been found based on the same principle as that of boiling stone which suppresses explosive boiling, micro concaves suppresses melt surface vibration of silicon melt.

PRIOR ART LITERATURE

Patent Literature

Patent Literature 1: Japanese Patent Application Laid-Open No. 2006-169084
Patent Literature 2: International Publication No. 2011/074568
Patent Literature 3: Japanese Patent Application Laid-Open No. 2004-250304

SUMMARY OF THE INVENTION

Problems to be Solved by the Invention

However, in Patent Literature 1, there are still problems such as it is difficult to manufacture a crucible with evenly scattered second-component silica sand, and melt surface vibration cannot be suppressed by the manufactured vitreous silica crucibles, which is a quality issue. And there is also a problem of the manufacture process being complex and costly. Further, although Patent Literature 1 discloses that it is effective with a 24-inches crucible, a problem that an effect of suppressing melt surface vibration during pulling of a silicon single crystal using a vitreous silica crucible with a larger opening diameter cannot be obtained, still exists. Moreover, it is possible to suppress the melt surface vibration in a region near the melt surface at the beginning of pulling, but when a silicon single crystal is pulled up gradually, a silicon melt surface exists in a region outside the region in which the bubble content rate of the crucible inner surface layer has been adjusted, and an effect of suppressing the melt surface vibration cannot be obtained, and therefore the yield of silicon single crystal is reduced significantly.

In the technique disclosed in Patent Literature 2, at least one micro concave is provided in each of the ring-shaped inner face portions divided in a height direction of a vitreous silica crucible at certain intervals, the effect of micro concaves cannot be exhibited in all the contact regions of silicon melt with a vitreous silica crucible inner face, and a complete suppression of melt surface vibration of silicon melt is difficult.

Accordingly, the present invention has been made in consideration of such a situation, and an object of the present invention is to provide a vitreous silica crucible which is easy to be manufactured and can suppress melt surface vibration from dipping of a seed crystal which is an initial stage of pulling of silicon single crystal to growing of single crystal.

Means for Solving the Problems

In order to solve the above-mentioned problems, the present inventors have researched extensively, and found that by analyzing a relationship between the structure of the inner surface of a crucible and melt surface vibration, melt surface vibration of silicon melt can be suppressed. The present inventors analyzed a relationship between the fine structure of the inner surface of the crucible and melt surface vibration. It is found that a vitreous silica crucible which is formed with a wave surface comprising a micro concavo-convex structure on the inner surface from an edge of a straight body portion to a corner portion direction, suppresses melt surface vibration of silicon melt during pulling of silicon single crystal, and the present invention has been completed based on the finding. Unlike the vitreous silica crucible manufactured by a method which is complex and insufficient in reproduction as in prior art (for example, Patent Literature 1), such vitreous silica crucible can suppress melt surface vibration stably. In addition, unlike the vitreous silica crucible disclosed in Patent Literature 3, even when the fine concavo-convex structure of the inner surface of the crucible is provided to a part other than the part near the silicon melt surface at the beginning of silicon single crystal pulling, not only the contacting of seed crystal at the beginning of silicon single crystal pulling can be surely performed stably, but also a transition during growing the silicon crystal is hard to occur. Further, unlike the vitreous silica crucible disclosed in Patent Literature 2, by providing the fine concavo-convex structure of the inner surface of the crucible to the SiO gas generation position other than the straight body portion, even when SiO gas is generated at any part of the contacting area between the vitreous silica crucible and the silicon melt, melt surface vibration can be suppressed. That is, the present invention is a vitreous silica crucible comprising: a substantially cylindrical straight body portion having an opening on a top end and extending in a vertical direction, a curved bottom portion, and a corner portion connecting the straight body portion with the bottom portion and a curvature of which is greater than that of the bottom portion; wherein an inner surface of the crucible has a concavo-convex structure in which a groove-shaped valley is interposed between ridges, and an average interval of the ridges is 5-100 μm. In addition, the present invention is a vitreous silica crucible comprising: a substantially cylindrical straight body portion having an opening on a top end and extending in a vertical direction, a curved bottom portion, and a corner portion connecting the straight body portion with the bottom portion and a curvature of which is greater than that of the bottom portion; wherein an inner surface of the crucible has a concavo-convex structure in which a groove-shaped valley is interposed between ridges, and a central line average roughness Ra of the concavo-convex structure is 0.02-0.5 μm.

BRIEF DESCRIPTION OF THE DRAWINGS

FIG. 1 is a schematic view showing a state of an objective lens 10 scanning on an inner surface 11 of a vitreous silica crucible.

FIG. 2 is a cross section view of a vitreous silica crucible 12, and is a schematic view illustrating a scanning direction of the objective lens.

FIG. 3 is a surface photo of an inner surface of a vitreous silica crucible without formation of a concavo-convex structure, obtained by a confocal laser microscope.

FIG. 4 is a surface photo of an inner surface of a vitreous silica crucible with formation of a groove-shaped concavo-convex structure, obtained by a confocal laser microscope.

FIG. 5 is a three-dimensional image of an inner surface of a vitreous silica crucible with formation of a groove-shaped concavo-convex structure, measured and treated using a confocal laser microscope.

FIG. 6 is a graph showing the results measuring the height of the inner surface of the vitreous silica crucible from position A to position B in FIG. 5. The reference point (Z=0) was set so that the height of the inner surface fell within Z=0-2 μm.

MODES FOR CARRYING OUT THE INVENTION

Vitreous Silica Crucible

A vitreous silica crucible 12 according to the present invention, for example, as shown in the cross section view of FIG. 2, comprises: a substantially cylindrical straight body portion 15 having an opening on a top end and extending in a vertical direction; a curved bottom portion 16; and a corner portion 17 connecting the straight body portion 15 with the bottom portion 16 and the curvature of which is greater than that of the bottom portion 16.

The vitreous silica is preferred to include a transparent layer 20 on the inside and a bubble layer 14 on the outside thereof. The transparent layer 20 is a layer formed on the inside of the vitreous silica crucible, and is substantially bubble-free. "Substantially bubble-free" means a bubble content rate and bubble diameter at such a degree that a single-crystal yield does not decrease due to the bubbles. Here, the bubble content rate means the volume of the bubbles occupying a unit volume of the crucible. The image of the crucible inner surface is taken by an optical camera, and the crucible inner surface is divided based on a constant volume as a reference volume W1. A volume W2 occupied by bubbles is determined for the reference volume W1, and calculated by P (%)=(W2/W1)*100. The bubble layer 14, for example, has a content rate of bubbles contained therein of 0.2% or more and 1% or less, and the average diameter of the bubbles is 20 μm or more and 200 μm or less.

The inner surface of the silica crucible has a concavo-convex structure in which groove-shaped valleys are interposed between ridges. When a fine concavo-convex structure is provided to the inner surface of the crucible, not only is explosive boiling of the silicon melt prevented to suppress melt surface vibration, but also the contact area between the silicon melt and the inner surface of the crucible is increased and the friction resistance therebetween is enhanced, and thus melt surface vibration is suppressed. In addition, when a fine groove-shaped concavo-convex structure is provided at the inner surface of the crucible, even when SiO gas is generated, a small turbulent flow occurs at the concavo-convex portion to attenuate the energy, and thus melt surface vibration is unlikely to occur.

In addition, the inner surface of the vitreous silica crucible is dissolved by a reaction between the crucible inner surface and the silicon melt. Therefore, oxygen is supplied to the silicon melt and this oxygen is mixed into the silicon single crystal and used to form a getter site. In the vitreous silica crucible of the present invention, since the contact area between the silicon melt and the crucible inner surface is increased, a reaction between the crucible inner surface and the silicon melt is likely to occur, oxygen can be efficiently supplied to the silicon melt, and thus a problem due to lack of oxygen can be prevented.

The concavo-convex structure is preferably provided to the entire inner surface of the straight body portion of the crucible, from the viewpoint of preventing melt surface vibration. In addition, it is preferably provided to the entire crucible, especially a position lower than the initial melt surface during pulling of silicon single crystal, from the viewpoint of supplying oxygen.

The groove-shaped valleys are preferred to extend substantially in the circumferential direction of the straight body portion of the crucible. When the valleys are formed along the circumferential direction, toward the top end or the bottom end of the straight body portion, the valley may be formed to be slightly inclined, and also may be formed to meander. When the valley extends in the circumferential direction, the contact resistances between the silicon melt and the crucible inner surface are increased especially, and melt surface vibration is effectively suppressed.

The average interval between ridges is 5-100 μm, preferably 20-60 μm, more preferably 15-50 μm. The interval between ridges is a distance from a top point to a top point of the ridges. The average interval is, more specifically, for example, 5, 10, 20, 30, 40, 50, 60, 70, 80, 90, or 100 μm, and it may be within the range between any two of the numerical values exemplified here. When the average interval is small, the contact area between the silicon melt and the crucible inner surface may be too large and the friction resistance therebetween may be too great to effectively suppress melt surface vibration. On the other hand, when the average interval is large, the contact area between the silicon melt and the crucible inner surface may be too small and the friction resistance therebetween may be too low to effectively suppress melt surface vibration. The intervals between ridges are preferably approximately equal intervals, for example, the interval between ridges is 15-50 μm, preferably 20-30 μm.

The concavo-convex structure can be measured in a non-contact manner by using an optical detection unit comprising: a light-emitting apparatus for irradiating light on the inner surface of the vitreous silica crucible, and a light-receiving apparatus for receiving the reflection of light irradiated on the inner surface of the vitreous silica crucible. As the irradiation light, for example, any light such as visible light, ultraviolet light, infrared light, and laser light can be used, as long as the concavo-convex structure of the crucible inner surface can be detected.

The light-emitting apparatus may be integrated into the optical detection unit, and in that case, those can be operated rotatably along the inner surface of the vitreous silica crucible are preferable. The light-receiving apparatus can be appropriately selected depending on the type of irradiation light, and, for example, an optical camera with a light-receiving lens and an image pickup unit can be used. For the purpose of detecting the concavo-convex structure of the inner surface, it is preferred that only light converging at the focal point is received by the light-receiving apparatus. For the purpose of receiving only the light converging at the focal point, it is preferred that the light-receiving apparatus includes, for example, a pinhole in front of the light detector.

As for a more particular measurement method, first, as shown in FIG. 1, an objective lens 10 is placed at the inner surface 11 of the crucible 12 in a non-contact manner. Next, by scanning toward scanning direction 13, the concavo-convex structure can be determined. As other scanning modes, for example, sample scanning mode and laser scanning mode are exemplified. Sample scanning mode is a mode of driving a stage carrying the sample in the XY-direction to obtain a two-dimensional image. Laser scanning mode is a mode of applying a laser in the XY-direction to scan on the sample two-dimensionally. Any scanning mode may be employed. As for the scanning direction, for example, vertical direction 18 and horizontal direction 19 of the straight body portion 15 are exemplified. In addition, it is also possible to scan only a part of the inner surface of the crucible. For example, it is possible to focus on scanning an area around the melt surface position contacted with the seed crystal.

By scanning as above, the focal point is scanned to obtain a two-dimensional image of the inner surface of the crucible. In addition, an image of a three-dimensional fine concavo-convex structure can be obtained by scanning in the wall thickness direction of the crucible (refer to FIG. 5). From the acquired image, it is possible to identify the direction of the groove-shaped valley. Also, the pitch (the average interval) between ridges may be quantified by scanning the focal point two-dimensionally, and measuring the ridges based on the brightness of the reflection. Further, for the sample, while scanning the focal point in the XY-direction, the Z-position information when focused is recorded and quantified, thus the height information of the sample can be obtained (refer to FIG. 6). These methods are preferable in that the scanning time can be shortened.

The average interval between ridges is a value obtained by dividing the sum of the values of intervals between the ridges by the number of intervals between the ridges. The average interval can be obtained by, for example, processing the image of the fine concavo-convex structure obtained by the measurement method as above with software.

The inner surface of the silica crucible has a concavo-convex structure, and the central line average roughness Ra is preferably 0.02-0.5 μm, more preferably 0.05-0.4 μm, and even more preferably 0.2-0.4 μm. The central line average roughness Ra is, specifically, for example, 0.02, 0.05, 0.1, 0.15, 0.2, 0.25, 0.3, 0.35, 0.4, 0.45, 0.5 μm, and it may be within the range between any two of the numerical values exemplified here.

The measured roughness curve is folded from the central line, and the area obtained by the roughness curve and the central line is divided by the length L to obtain a value from which the central line average roughness Ra can be calculated. The roughness curve and the like, can be measured in the same manner as the groove-shaped concavo-convex structure, and calculated by processing with software.

The silica crucible of the present invention has a groove-shaped concavo-convex structure, as described above, even though having a fine concavo-convex structure with a central line average roughness Ra in a predetermined range, it can effectively suppress vibration of the melt surface.

Method of Manufacturing Vitreous Silica Crucible

Next, an embodiment of the method for manufacturing a vitreous silica crucible according to the present invention will be explained.

Silica powder used for manufacturing a vitreous silica crucible includes crystallized natural silica powder and amorphous synthetic silica powder manufactured by chemical synthesis. Natural silica powder is silica powder manufactured by pulverizing natural mineral mainly consisting of α-quartz. The synthetic silica powder can be manufactured by means of chemical synthesis such as gas phase oxidation of silicon tetrachloride ($SiCl_4$) (dry synthesis method), or hydrolysis of silicon alkoxide (Si ($OR_4$) (sol-gel method).

First, a natural silica powder is supplied to a mold used for a vitreous silica crucible. The natural silica powder can be manufactured by pulverizing natural mineral mainly consisting of α-quartz. Next, a vitreous silica crucible comprising an inner face layer (synthetic layer) vitrified from synthetic silica powder and an outer face layer (natural layer) vitrified from natural silica powder, is manufactured by supplying a synthetic silica powder on the natural silica powder, and melting the silica powder by Joule heat of arc discharge followed by cooling. In the initial stage of the arc melting process, bubbles are removed by subjecting the silica powder layer to a strong depressurization, and thus a transparent vitreous silica layer (transparent layer) is formed, and subsequently, a vitreous silica layer (bubble layer) containing bubbles left by weakening the depressurization is formed. Here, the inner face layer formed from the synthetic silica powder is not necessarily the same as the transparent layer. Moreover, the outer face layer formed from the natural silica powder is not necessarily the same as the bubble layer.

The melting of the silica powder is preferably performed so that the maximum temperature of the inner surface of the rotating mold is up to 2000-2600 deg. C. When the maximum temperature is lower than 2000 deg. C., the gas remaining as bubbles during the manufacture of the vitreous silica or in the vitreous silica cannot be removed completely, and the crucible may expand markedly during the pulling of silicon single crystal. In addition, when the maximum temperature is higher than 2600 deg. C., the viscosity of the vitreous silica is reduced and shape collapse may occur.

Arc melting is performed, for example, by arc discharge of three-phase (R phase, S phase, T phase) alternating current. Therefore, in the case of three-phase alternating current, 3 carbon electrodes are used to generate arc discharge; and thereby the silica powder layer is melted. Arc melting starts the arc discharge at the position where the tip of the carbon electrode is positioned higher than the opening portion of the mold. Thus, the silica powder layer near the opening portion of the mold is melt preferentially. Thereafter, the carbon electrode is lowered to melt the silica powder layer of the straight body portion, the corner portion, and the bottom portion.

When lowering the carbon electrode, by stepwise lowering it, a groove-shaped concavo-convex structure in which groove-shaped valleys are interposed between the ridges can be formed on the inner surface of the crucible. The lowering rate of the carbon electrode can be 10-35 mm/min, specifically, for example, 10, 13, 15, 17, 18, 20, 23, 25, 28, 30, or 35 mm/min, and it may be within the range between any two of the numerical values shown herein. The lowering rate may be an average value. Stepwise lowering means lowering while repeatedly lowering and stopping, for example, and may be pulse drive which repeats the lowering and stopping of the arc electrode. In this case, the pulse width is, for example, 5, 10, 20, 30, 40, 50, 60, 70, 80, 90, 100 ms, and it can be in the range between two values of the values exemplified here. For example, when the lowering rate is 10-30 (mm/min), the pulse width may be 50-250 ms. The duty cycle can be, for example, 30-70%, specifically, 30, 40, 45, 50, 55, 60, 70%, and it may be within the range between any two of the numerical values exemplified herein. The duty cycle is preferably 45-55%, more preferably 50%, for the purpose of obtaining a constant interval between ridges.

Moreover, by lowering while vibrating the carbon electrode, a concavo-convex structure in which the central line average roughness Ra is 0.02-0.5 μm can be formed.

Example of Use

The vitreous silica crucible according to the present invention, for example, can be used as follows.

In a vitreous silica crucible, polysilicon is melted to produce silicon melt, and a silicon single crystal can be manufactured by pulling up while rotating a seed crystal with the tip of the silicon seed crystal being immersed in the silicon melt. The shape of the silicon single crystal is as follows: a cylindrical silicon seed crystal from the upper side, followed by a conical silicon single crystal, a cylindrical silicon single crystal having the same diameter as the bottom surface of the upper conical silicon single crystal, and a silicon single crystal having a vertex orienting downward.

The pulling of silicon single crystal is usually performed at about 1420 deg. C. Particularly at an initial stage of the pulling, a melt surface vibration is likely to occur. The vitreous silica crucible of the present invention can suppress the occurrence of melt surface vibration since a particular concavo-convex structure is formed in the inner surface.

EXAMPLES

Example 1

A vitreous silica crucible of Example 1 was manufactured on the basis of a rotating mold method. The carbon mold opening diameter was 32 inches (813 mm), the average thickness of silica powder layer deposited on the mold inner surface was 15 mm, arc discharge was performed with three electrodes using three-phase alternating current. The energization time of the arc melting process was 90 minutes, output was 2500 kVA, and the silica powder layer was depressurized 90 kPa from atmospheric pressure for 10 minutes from the start of energization. During arc melting, the carbon electrode stepwisely descended. The average descending rate was 20 mm/min, the pulse width was 100 ms, and the duty cycle was 50%.

Comparative Example 1

The vitreous silica crucible of Comparative Example 1 was manufactured in the same manner as in Example 1, except that the carbon electrode descended continuously (descending rate: 20 mm/min) during arc melting.

Comparative Example 2

The vitreous silica crucible of Comparative Example 2 was manufactured in the same manner as in Example 1, except that the carbon electrode descended gradually with an average descending rate of 35 mm/min, a pulse width of 100 ms, and a duty cycle of 50%, during arc melting.

Comparative Example 3

The vitreous silica crucible of Comparative Example 3 was manufactured in the same manner as in Example 1, except that the carbon electrode descended gradually with an average descending rate of 10 mm/min, a pulse width of 100 ms, and a duty cycle of 50%, during arc melting.

The manufacture conditions of Example 1 and Comparative Examples 1-3 are partially shown in table 1.

TABLE 1

| | Descending method of the carbon electrode | Average descending rate [mm/min] | Pulse width [ms] | Duty cycle [%] |
|---|---|---|---|---|
| Example 1 | gradually | 20 | 100 | 50 |
| Comparative Example 1 | continuously | 20 | — | — |
| Comparative Example 2 | gradually | 35 | 100 | 50 |
| Comparative Example 3 | gradually | 10 | 100 | 50 |

(1) Surface Structure

In the vitreous silica crucibles of Example 1 and Comparative Examples 1-3, the surface of the transparent layer of the straight body portion was observed using a confocal laser microscope. The scanning direction was in the vertical direction from the rim of the vitreous silica crucible. The scanning surface was an area of 3 cm×3 cm of a vitreous silica crucible of before use. The results are shown in Table 3 and 4.

FIG. 3 is a surface photo of the inner surface of the vitreous silica crucible according to Comparative Example 1, obtained by a confocal laser microscope. As shown in FIG. 3, at the inner surface of the conventional vitreous silica crucible, a concavo-convex structure was not observed but an uneven distortion structure was observed.

FIG. 4 is a surface photo of the inner surface of the vitreous silica crucible according to Example 1, obtained by a confocal laser microscope. As shown in FIG. 4, at the inner surface of the vitreous silica crucible according to Example 1, a concavo-convex structure in which groove-shaped valleys were interposed between ridges was formed.

At the inner surface of the vitreous silica crucible according to Comparative Example 2, a concavo-convex structure was formed, but the interval between the ridges was wide (not shown).

For more detailed analysis, a three dimensional image of the inner surface of the vitreous silica crucible of Example 1 was obtained using a confocal laser microscope. FIG. 5 is the obtained three-dimensional image. As shown in FIG. 5, a concavo-convex structure was formed such that it was orthogonal to position A to B. It should be noted that position A is at the opening portion side of the crucible, and position B is at the bottom portion side of the crucible.

FIG. 6 was obtained by graphing the height of the inner surface of the vitreous silica crucible from position A to position B. The reference point (Z=0) was set so that the height of the inner surface fell within Z=0-2 μm. As a result, a concavo-convex structure in which multiple groove-shaped valleys interposed between ridges were detected. All results of the obtained average intervals are shown in Table 2.

(3) Central Line Average Roughness Ra

For the inner surface of the vitreous silica crucible of Example 1, while scanning the focal point in the XY direction, the Z position information when focused was recorded and quantified, and thus the height of the sample was measured. The central line average roughness Ra was calculated by using numerical processing software to obtain a result of 0.37 μm.

In the same manner as Example 1, the central line average roughness Ra was obtained for Comparative Examples 1, 2, and 3. The results were respectively, 0.65 μm, 0.78 μm, and 0.01 μm. All results of the obtained central line average roughness Ra are shown in Table 2.

(4) Melt Surface Vibration

In each of the vitreous silica crucibles of Example 1 and Comparative Examples 1-3, about 500 kg of polysilicon was added, and heated to a temperature of about 1450-1600 deg. C. by using a carbon heater, then the presence of melt surface vibration was confirmed by observation camera while performing silicon single crystal pulling. For the vitreous silica crucibles of Comparative Examples 1, 2, and 3, the occurrence of melt surface vibration was confirmed. On the other hand, for the vitreous silica crucible of Example 1, the suppression of melt surface vibration was confirmed.

TABLE 2

| | Average interval [μm] | Central line average roughness Ra [μm] | occurrence of melt surface vibration |
|---|---|---|---|
| Example 1 | 25 | 0.37 | no |
| Comparative Example 1 | — | 0.65 | yes |
| Comparative Example 2 | 105 | 0.78 | yes |
| Comparative Example 3 | 3 | 0.01 | yes |

From the results above, unlike the vitreous silica crucible manufactured by a method which is complex and poorly reproducible as in prior art (for example, Patent Literature 1), the vitreous silica crucible of the present invention can suppress melt surface vibration stably. In addition, not only when immersing the seed crystal in the initial stage of the pulling process of silicon single crystal, but also during the growing of silicon single crystal, melt surface vibration can be suppressed stably.

The invention claimed is:

1. A vitreous silica crucible comprising;
a substantially cylindrical straight body portion having an opening on a top end and extending in a vertical direction;
a curved bottom portion; and
a corner portion connecting the straight body portion with the bottom portion; and
a curvature of which is greater than that of the bottom portion,
said vitreous silica crucible characterized in that, an inner surface of the crucible has a concavo-convex structure in which groove-shaped valleys are interposed between ridges, and an average interval of the ridges is 5-100 μm.

2. The vitreous silica crucible according to claim 1, wherein the valleys extend substantially in a circumferential direction of the straight body portion.

3. The vitreous silica crucible according to claim 1, wherein a central line average roughness Ra of the inner surface of the crucible is 0.02-0.5 μm.

* * * * *